US006797969B2

(12) United States Patent
Gerlach et al.

(10) Patent No.: US 6,797,969 B2
(45) Date of Patent: Sep. 28, 2004

(54) MULTI-COLUMN FIB FOR NANOFABRICATION APPLICATIONS

(75) Inventors: Robert L. Gerlach, Portland, OR (US); Paul P. Tesch, Portland, OR (US); Lynwood W. Swanson, McMinnville, OR (US); Mark W. Utlaut, Scappoose, OR (US)

(73) Assignee: FEI Company, Hillsboro, OR (US)

( * ) Notice: Subject to any disclaimer, the term of this patent is extended or adjusted under 35 U.S.C. 154(b) by 301 days.

(21) Appl. No.: 09/781,125

(22) Filed: Feb. 8, 2001

(65) Prior Publication Data

US 2001/0032939 A1 Oct. 25, 2001

Related U.S. Application Data

(60) Provisional application No. 60/181,248, filed on Feb. 9, 2000.

(51) Int. Cl.[7] .............................. G21G 5/00; A61N 5/00
(52) U.S. Cl. ............................... 250/492.3; 250/396 R; 250/491.1; 250/492.1; 250/492.2; 250/492.21
(58) Field of Search .......................... 250/492.3, 492.2, 250/492.21, 492.1, 491.1, 396 R

(56) References Cited

U.S. PATENT DOCUMENTS

| | | | |
|---|---|---|---|
| 3,717,785 A | | 2/1973 | Guernet ...................... 313/231 |
| 4,126,781 A | | 11/1978 | Siegel ......................... 250/281 |
| 4,367,429 A | * | 1/1983 | Wang et al. ............. 313/362.1 |
| 4,390,789 A | | 6/1983 | Smith et al. ............. 250/492.2 |
| 4,694,178 A | | 9/1987 | Harte ...................... 250/396 R |
| 4,757,208 A | * | 7/1988 | McKenna et al. ....... 250/492.2 |
| 4,818,872 A | | 4/1989 | Parker et al. ............... 250/309 |
| 4,902,898 A | * | 2/1990 | Jones et al. .............. 250/492.2 |
| 4,985,634 A | * | 1/1991 | Stengl et al. ............ 250/492.2 |

(List continued on next page.)

FOREIGN PATENT DOCUMENTS

| | | | |
|---|---|---|---|
| JP | 57228416 | 12/1982 | .......... H01J/37/317 |
| JP | 07159063 | 6/1995 | .......... H01J/37/305 |
| WO | WO98/48443 | 10/1998 | |
| WO | WO9934397 | 7/1999 | ............ H01J/37/28 |
| WO | WO9947978 | 9/1999 | .......... H01J/37/317 |

OTHER PUBLICATIONS

Ngo V. V; Barletta B; Gough R; Lee Y; Leung N. and Zahir N. "Maskless Mirco–Ion–Beam Reduction Lithography", EIPBN 1999, pp 241–242.

Kim H. S; Yu M. L; Thomson M; G.R; Kratschmer E. and Chang J. "Performance of Zr/O/W Schottky Emitters at Reduced Temperature", Vac. Sci. Technol. B. 15(6), Nov./Dec. 1987, pp 2284–2288.

Leung K. "Plasma Sources for Electron and Ion Beams", EIPBN 1999, pp 373.

Primary Examiner—John R. Lee
Assistant Examiner—Bernard E. Souw
(74) Attorney, Agent, or Firm—Michael O. Scheinberg

(57) ABSTRACT

A multi-gun FIB system for nanofabrication provides increased throughput at reduced cost while maintaining resolution. Multiple guns are maintained in modular gun chambers that can be vacuum isolated from the primary vacuum chamber containing the targets. A system can include multiple gun chambers, each of which van include multiple guns, with each gun chamber being capable of being vacuum isolated, so that each gun chamber can be removed and replaced without disturbing the vacuum in other gun chambers or in the main chamber. An optical column is associated with each gun. Optical elements for multiple columns can be formed in a bar that extends into several columns. Some of the optical elements are positioned in the gun chambers and others are positioned in the primary vacuum chamber. A through-the-lens secondary particle collection can be used in connection with each of the individual columns.

30 Claims, 6 Drawing Sheets

U.S. PATENT DOCUMENTS

| | | | |
|---|---|---|---|
| 5,104,684 A * | 4/1992 | Tao et al. .................... | 427/526 |
| 5,199,917 A | 4/1993 | MacDonald et al. .......... | 445/24 |
| 5,363,021 A | 11/1994 | MacDonald ................. | 315/366 |
| 5,435,850 A | 7/1995 | Rasmussen ................. | 118/726 |
| 5,637,539 A | 6/1997 | Hofmann et al. ............. | 438/20 |
| 5,834,770 A | 11/1998 | Holkeboer et al. ......... | 250/281 |
| 5,945,677 A * | 8/1999 | Leung et al. ........... | 250/396 R |
| 5,973,447 A * | 10/1999 | Mahoney et al. ........ | 313/359.1 |
| 5,981,962 A | 11/1999 | Groves et al. ......... | 250/492.23 |
| 6,023,060 A | 2/2000 | Chang et al. ............... | 250/310 |
| 6,218,060 B1 | 4/2001 | Yasuda et al. ................. | 430/30 |
| 6,218,664 B1 | 4/2001 | Krans et al. ................. | 250/310 |
| 6,222,196 B1 * | 4/2001 | Mack .................... | 250/492.21 |
| 6,232,787 B1 * | 5/2001 | Lo et al. ..................... | 324/751 |
| 2001/0032938 A1 * | 10/2001 | Gerlach et al. .......... | 250/492.3 |
| 2001/0032939 A1 * | 10/2001 | Gerlach et al. .......... | 250/492.3 |
| 2002/0053643 A1 * | 5/2002 | Tanaka et al. ........... | 250/491.1 |
| 2002/0084426 A1 * | 7/2002 | Gerlach et al. .......... | 250/492.1 |
| 2002/0134949 A1 * | 9/2002 | Gerlach et al. ........ | 250/492.21 |
| 2002/0166976 A1 * | 11/2002 | Sugaya et al. ......... | 250/440.11 |

* cited by examiner

MULTI-COLUMN FIB FOR NANOFABRICATION APPLICATIONS

RELATED APPLICATIONS

This application claims priority from U.S. Provisional Patent Application No. 60/181,248 filed Feb. 9, 2000.

TECHNICAL FIELD OF THE INVENTION

The present invention relates to the field of focused ion beam (FIB) systems, and in particular, to multi-column FIB systems providing high throughput for milling, enhanced etch, and deposition applications.

BACKGROUND OF THE INVENTION

Thin film head trimming and other nanofabrication applications suffer from throughput limitations, that is, the focused ion beam systems are unable to process products as quickly as desired. One approach to increasing processing speed is to increase the current in a given beam, thereby increasing the rate at which material is removed or deposited. Unfortunately, systems are approaching fundamental limits for beam current within the small beam diameters required.

Another solution to increasing throughput is simply to use additional FIB systems. Because FIB systems are complex and include a variety of subsystems, each individual system is costly.

To increase throughput in electron beam lithography and semiconductor inspection areas, researchers have begun using multiple electron field emitters or photoemission sources in a single system. For example, multiple electron beam systems are described in U.S. Pat. No. 4,390,789 to Smith for "Electron Beam Array Lithography System Employing Multiple Parallel Array Optics Channels and Method of Operation" and U.S. Pat. No. 5,981,962 to Groves et al. for a "Distributed Direct Write Lithography System Using Multiple Variable Shaped Electron Beams."

These multi-beam electron beam system designs do not readily transfer to ion beam systems because the ion optical columns operate at much higher voltages and therefore present design problems that are not present in electron beam systems. Designing an array of high voltage FIB columns that operate at beam voltages of about +30,000 V presents problems that are quite different from those involved in designing an array of electron beam columns, which typically operate between about −500 to −5000 V, for lithography or inspection. Moreover, the higher voltage power supplies are bulkier and more costly than low voltage ones required for electron beam systems, making it difficult to produce a compact and competitively priced multicolumn FIB system.

U.S. Pat. No. 5,945,677 to Leung et al. for a "Focused Ion Beam System" describes two approaches for multiple ion beam systems using one or more plasma ion sources. In the first approach, a single multicusp plasma ion source is used to produce multiple beamlets. The second approach employs multiple FIB units, each having a separate ion source and acceleration column. Such systems are complex, and no large area source, multiple column systems are currently commercially available. Furthermore, multicusp sources, which are about 100 times less bright than liquid metal field ion sources, have so far not achieved sufficient brightness to be commercially practical.

Thus, a practical, cost effective solution for increasing focused ion beam throughput while maintaining resolution is still needed.

SUMMARY OF THE INVENTION

An object of the present invention is to increase processing speed for nanofabrication without sacrificing processing precision by providing a precision multi-column FIB system.

The present invention includes a method of increasing the throughput of a FIB system, a FIB system capable of increased throughput, and a method of making and using the FIB system. The invention also includes several novel aspects of the FIB system, including the modular design of the gun chambers, the design of the electrodes, including their electrical isolation, the secondary particle collection system, and the electrode voltage application scheme.

A FIB system of the present invention comprises multiple ion guns, each preferably including a Liquid Metal Ion Source (LMIS) and associated with a corresponding FIB optical column. The beams from the multiple columns are directed to one or more targets in a primary vacuum chamber. The multiple guns increase the number of ions impacting the target or targets and therefore increase the processing rate. For example, the multiple beams can operate on different wafers, or on different parts of a single wafer, with the wafer or wafers being in a single primary vacuum chamber. Because each of the multiple columns has substantially the same resolution and beam current as that of a column in a single gun FIB system, accuracy and precision is not degraded as processing speed is increased. Because the multiple columns share a primary vacuum chamber and can share other facilities, such as power supplies, a computer and a user interface, the initial cost and operating cost of a system of the invention is greatly reduced compared to the costs associated with multiple, separate complete FIB systems.

Preferably, each FIB gun is placed in a vacuum chamber, referred to as a gun chamber, that can be evacuated independently from the primary vacuum chamber. Multiple such gun chambers, each containing one or more FIB guns, can be placed in parallel to form a large array of guns for operating on one or more targets in the primary vacuum chamber. A common, ganged vacuum valve for each gun chamber can isolate the gun chamber from the main chamber. Moreover, the gun chambers can be evacuated and sealed prior to installation, thereby avoiding the loss of production that would occur if the gun chamber were evacuated after installation. By separating the gun chamber or chambers from the main chamber, gun chambers can be replaced without disrupting the vacuum in the main chamber, thereby avoiding the introduction of contaminants and saving the time required to re-evacuate the main chamber. By having guns in separate gun chambers, some guns can be replaced without disturbing others. A gun chamber can be replaced as a module in the field, with the repairs or replacements of individual guns being performed at the factory.

Each gun has a corresponding ion optical column, with some of the column elements preferably being placed below the guns in the main system chamber to form an array of columns. To reduce complexity and to increase the placement precision between columns, column elements can be made common between the columns by using bars with precision cut holes to form the lens elements.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

The embodiments described below accomplish several difficult design goals for multi-column FIB systems. The optical elements are sufficiently electrically isolated to maintain the required high operating voltages. In some embodiments, the number of high voltage power supplies is reduced from the number that would be required in multiple independent columns. The voltage level of the high voltage power supplies are also reduced from that of conventional FIB systems. In addition, the difficulties of keeping multiple LMIS's (Liquid Metal Ion Sources) operating and maintained with minimum down time is addressed by using a vacuum sealable, multiple gun chamber as described below.

Figure 1:
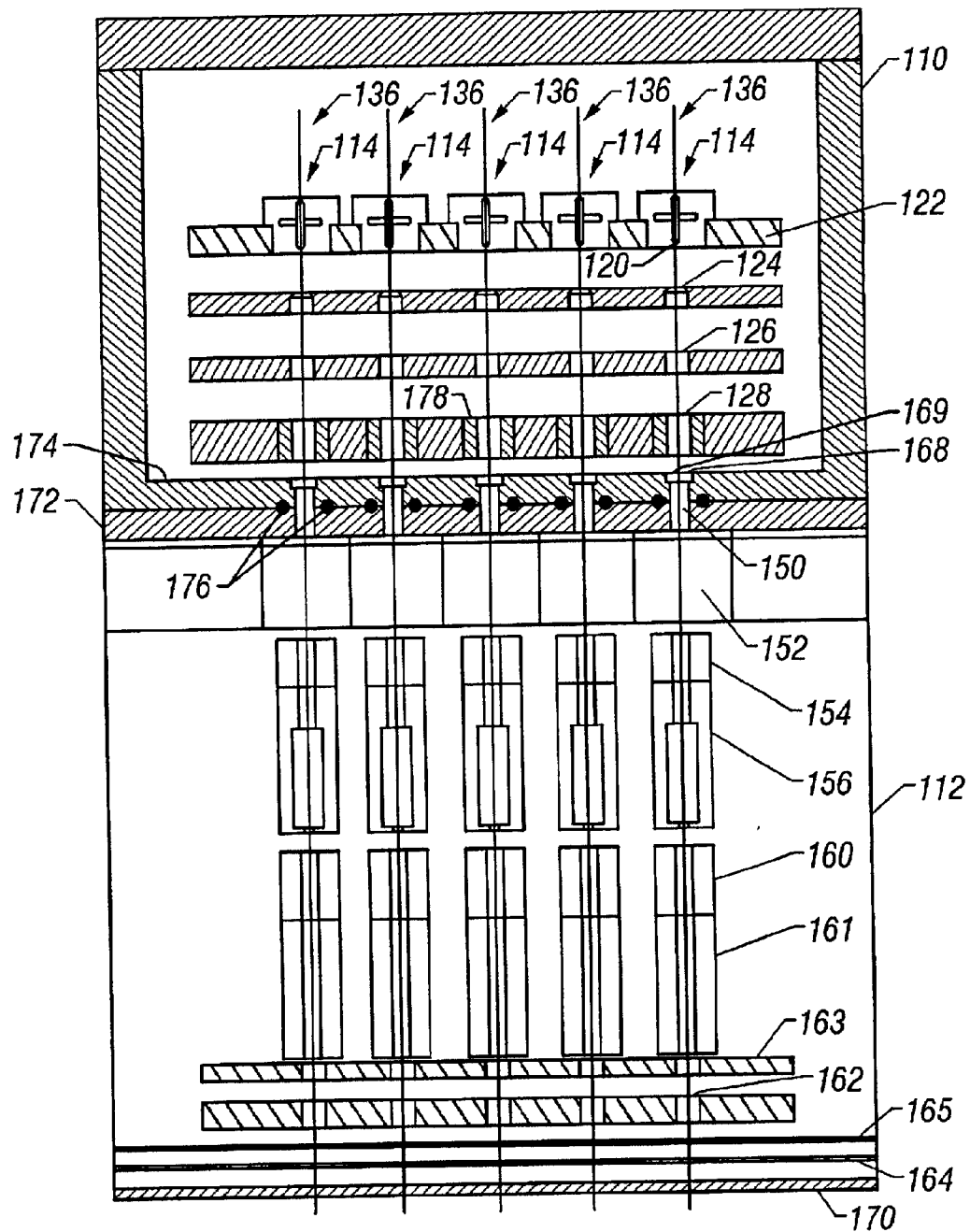
FIG. 1 is a side, cross-sectional view of a single FIB column set containing five FIB columns.
Figure 2A:
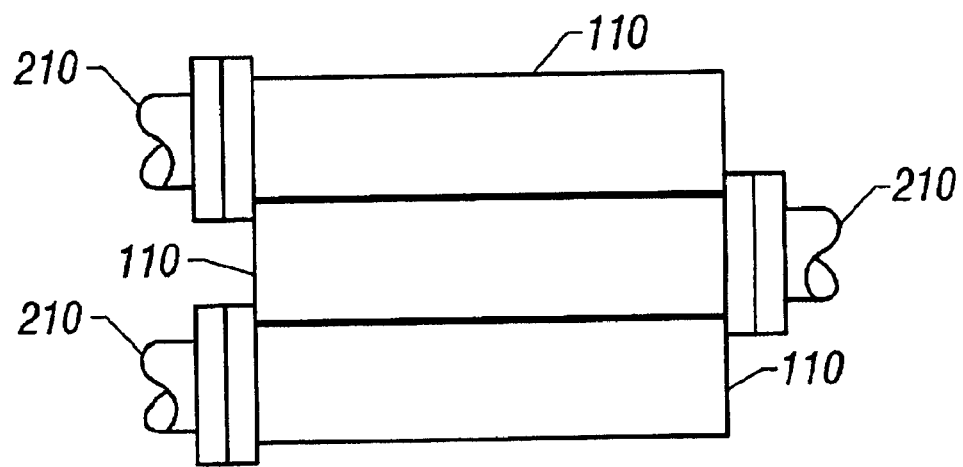
FIG. 2A is a top view of three column sets fastened together to form a 15 column array.
Figure 2B:
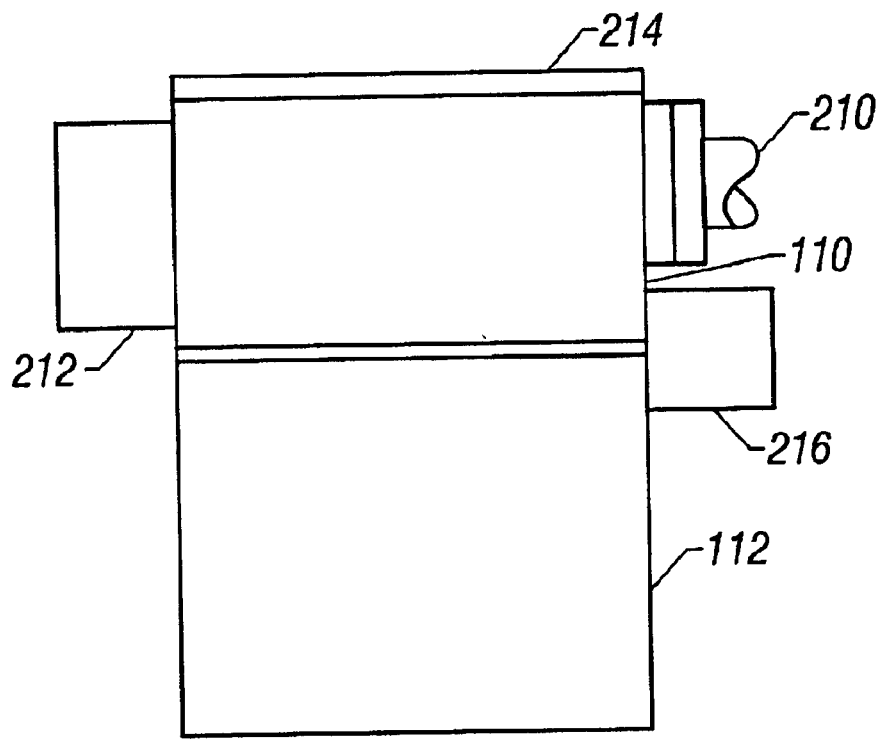
FIG. 2B is a side view of these three column sets.

FIGS. 1, 2A, and 2B show a multi-column FIB array using LMIS's. FIG. 1 shows a multi-column FIB system 108 that includes a gun vacuum chamber 110 and a primary vacuum chamber 112. Gun chamber 110 is a single, sealable vacuum chamber that includes a set of ion guns 114. Gun chamber 110 can be replaced as a unit and has its own vacuum pump, preferably an ion pump (not shown). When one of the guns 114 in gun chamber 110 fails, the entire gun chamber 110 can be replaced with another gun chamber 110 that is already evacuated to an ultra high vacuum and ready to begin operation. Thus, multi-column system 108 does not need to remain out of production while the gun chamber is being evacuated.

Each ion gun 114 includes an emitter 120, a suppressor 122, an extractor 124, an acceleration lens 126, a deceleration lens 128 and a ground element 169. The four elements 124, 126, 128 and 169 of each column together are referred as the "lens 1" of the column. Although FIG. 1 shows a lens 1 comprising four lens elements, other lens designs can be used for lens1. Also, some or all of the elements of lens 1 could alternatively be positioned in primary vacuum chamber 112.

Each ion gun 114 forms part of an ion optical column 136 that also includes an aperture 152, a steering element 154, a blanking element and Faraday cup 156, dual deflection elements 160 and 161, second lens elements 163, 162 and 165 (referred to collectively as the "lens 2"), and a detector 164. At the bottom of each column is a work piece or target 170, such as a semiconductor wafer. An isolation valve 150 at the bottom of each gun 114 selectively closes a beam hole 168, thereby vacuum isolating gun chamber 110. The isolation valves 150 of the column in a gun chamber 110 are preferably "ganged," that is, connected in a manner so that all valves are opened or closed together. The detectors 164 for the columns 136 are also preferably ganged, that is, physically and electrically connected, but constructed so that each column's secondary electrons are independently detected. The aperture 152 preferably comprises an automatic variable aperture. Such apertures are known and details are not shown in FIG. 1. A gas injection can optionally be used with apparatus of FIG. 1 to inject a gas for ion beam assisted deposition or for enhanced etching. The construction and operation of such systems are known and are described, for example, in U.S. Pat. No. 5,435,850 to Rasmussen.

The gun elements, that is, emitters 120, suppressors 122, extractors 124, acceleration lenses 126, deceleration lenses 128, and ground element 169 are preferably contained in gun chamber 110. The number of guns in gun chamber 110 is preferably limited to about five. If one of the emitters 120 fails, then the exchange of a five-gun set is easier and less costly than replacing a larger number of guns, such as ten or more guns. Moreover, the restarting of five emitters in parallel is also much less prone to failure than restarting a larger number simultaneously. The set of ganged isolation valves 150 for the set of guns simultaneously isolates the beam holes 168 in the ion beam paths at the bottom of gun chamber 110 from the primary vacuum chamber 112.

Valves 150 are preferably formed by a bar 172 that moves relative to bottom portion 174 of gun chamber 110. When valves 150 are open, the openings in bar 172 line up with the openings 169 in bottom portion 174. To seal gun chamber 110, bar 172 is shifted so that the holes in bar 172 are offset from the holes in bottom portion 174, and O-rings 176 form a seal between a solid portion of bar 172 and bottom portion 174. Before shifting bar 172, it is preferably lowered away from O-rings 176 to prevent damage to the O-rings that can create contamination and vacuum leakage. After bar 172 is shifted, it is raised again into contact with O-rings 176 to create a vacuum seal to isolate gun chamber 110. Primary chamber 112 can be exposed to air when gun chamber 110 is removed or alternatively, primary chamber 112 can be made sealable by using a second set of valves (not shown). Details of the mounting of gun chamber 110 to primary chamber 112 are conventional and not shown.

A multiple ion column system could use a single gun chamber 110 or multiple gun chambers. FIG. 2A shows a top view of an arrangement of multiple linear gun chambers 110 grouped to form a two-dimensional array of fifteen guns. The number of guns per gun chamber can be varied, as well as the number of gun chambers to produce a system having the desired number of FIB columns for a particular application. FIG. 2A shows an outlet 210 from each gun chamber 110 to an associated ion pump.

FIG. 2B is a side view of the multiple gun chamber system of FIG. 2A. FIG. 2B shows also a location for high voltage feed-throughs 212, a flange 214 at the top of a gun chamber 110, and an actuator 216 for ganged gate valves 150.

The construction of the optical elements, such as extractors 124, acceleration lenses 126, and deceleration lenses 128 in gun chamber 110, can be simplified by using flat bars with holes to form lens elements. This construction technique can also be used to construct optical elements in the primary vacuum chamber. Using a single bar to form corresponding lens elements in different columns with a gun chamber can reduce the number of high voltage power supplies required.

Figure 3:
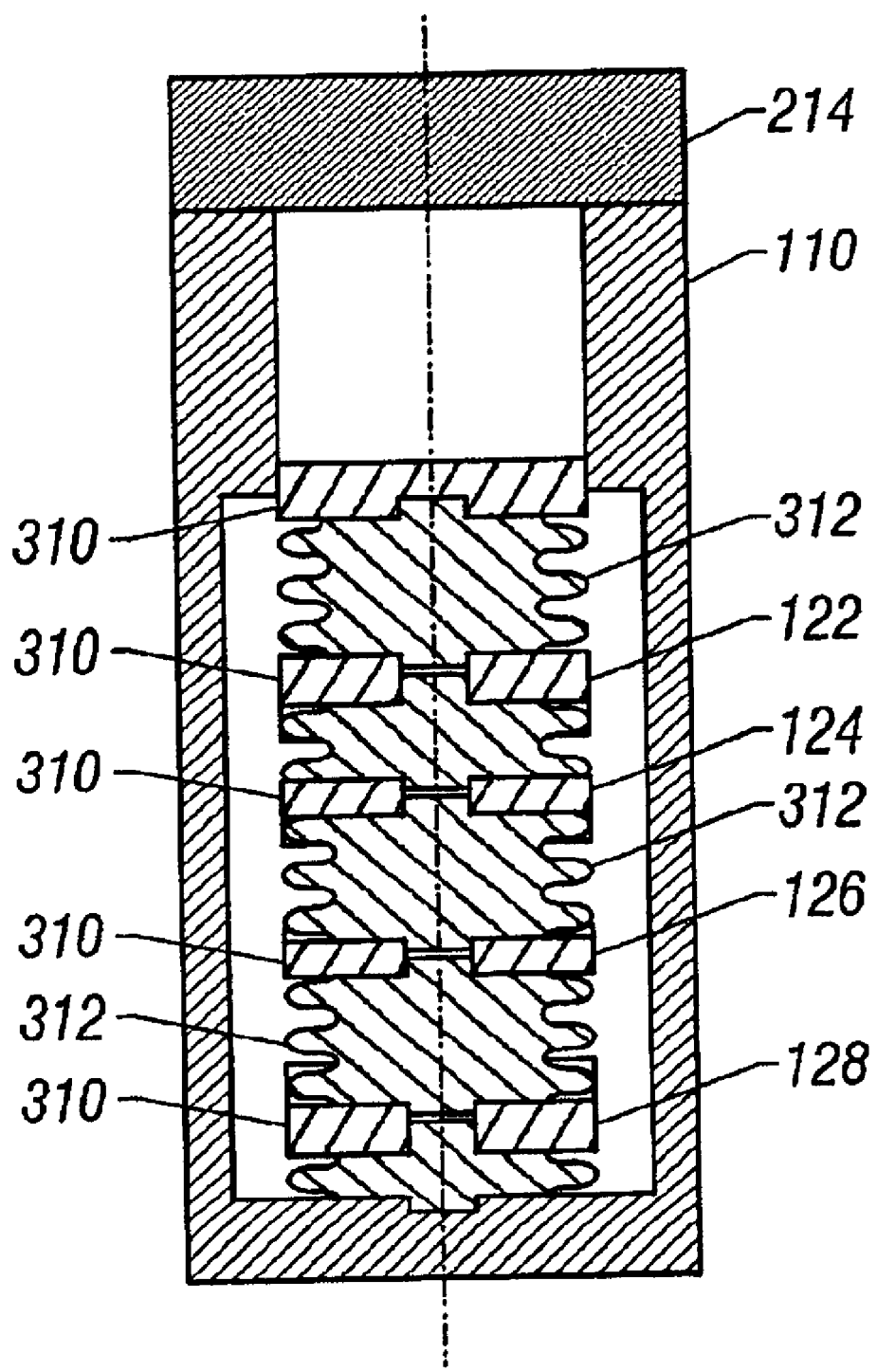
FIG. 3 is an end cross sectional view of a gun set using high voltage insulators.

FIG. 3 is a cross-sectional view of a gun chamber 110 showing bars 310 used to form optical elements. Bars 310 form suppressors 122, extractors 124, acceleration lenses 126, and deceleration lenses 128. Bars 310 are electrically isolated from each other and from the chamber itself using HV (High Voltage) insulator disks 312 composed preferably of a ceramic material. Other means, such as dielectric balls, can be used to isolate the gun HV elements. The assembly may be glued together using a suitable epoxy or other means known in the art. After the bars and insulators are installed in the casing of gun chamber 110, the assembly can optionally be machined to provide additional accuracy in shaping and aligning the lens elements.

The optical elements can be formed directly by the holes in a conductive bar, as shown with regard to acceleration lenses 126. A common voltage is thus applied to all lenses formed by the bar, reducing the number of high voltage power supplies required for the multi-column system. The number of high voltage power supplies can be further reduced by using a common high voltage supply for corresponding bars in multiple gun chambers. Conductive bars are typically made of a titanium alloy having a low thermal coefficient of expansion.

Optical elements can also be formed by inserts placed into holes in a bar. For example, FIG. 1 shows the use of lens inserts 178 in the bar 310 forming deceleration lenses 128. The bar in which lenses 128 are formed is constructed from an insulating material, for example, a ceramic material such as alumina, and the lens inserts are composed of a conductive material, preferably a titanium alloy which has is low thermal coefficient of expansion that is similar to that of the alumina bar. The alumina bar provides high voltage isolation to the individual lenses 128 with respect to the bars 310. Voltage is applied to the individual lenses by wires connected to the lenses in a conventional manner, such as conductive silver epoxy or using connector pins. Alternatively, metal films can be placed upon the insulator bar to replace the wires.

Another method of providing high voltage insulation to lenses 128 entails using a conductive bar 310, with an insulating insert placed in a hole in the bar, and then a conductive lens placed in the insulating insert. Such inserts can be glued into insulator material, which can then be glued into the bars. Lenses formed by inserts can also be post machined, that is, machined after assembly, for additional accuracy in shape and alignment. These construction methods that individually isolate lenses can be particularly useful for suppressor lenses 122, extractor lenses 124, or individual elements of lens 1 or lens 2.

FIG. 1 shows inserts used only on the deceleration lens 128. Deceleration lens 128 can be operated near ground potential, which simplifies the power supply requirements for lens 1. Isolating lens elements allows the voltages in individual columns to be controlled. For example, the voltage on one of extractor lenses 124 can be individually boosted about 2 kV above the common extractor voltage to start or restart the individual emitter in the corresponding column. The extractor lens 124 can then return to or near the common extractor voltage for normal operation. Optical elements that are isolated can still use the common high voltage supply, but isolated elements can also be floated at a voltage above or below the common voltage, thereby reducing the number of high voltage power supplies required.

Charged particle signal detection capability for imaging can be accomplished by a traditional side mounted electron multiplier or scintillator means, or by two other novel methods described below. For many nanofabrication applications, the beam current can be greater than a nanoampere. At this level of current, an amplifier or amplifiers can be attached directly to detector plate 164 below lens 2. Separate detector plates for each column could also be used.

Alternatively, through-the-lens (TTL) electron detection can be used. Through-the-lens electron detection is known and described, for example, incorporated into an electron column in PCT Publication WO 99/34397 of Krans et al. In the Krans et al. design, the lens 2 center element and upper element (and optionally the lower element) are biased to positive potentials to draw the electrons from the sample up and above the lens, where they are detected by a channel plate electron multiplier, which is placed roughly perpendicular to the ion column axis, and has a hole in its center to pass the primary beam.

Figure 4:
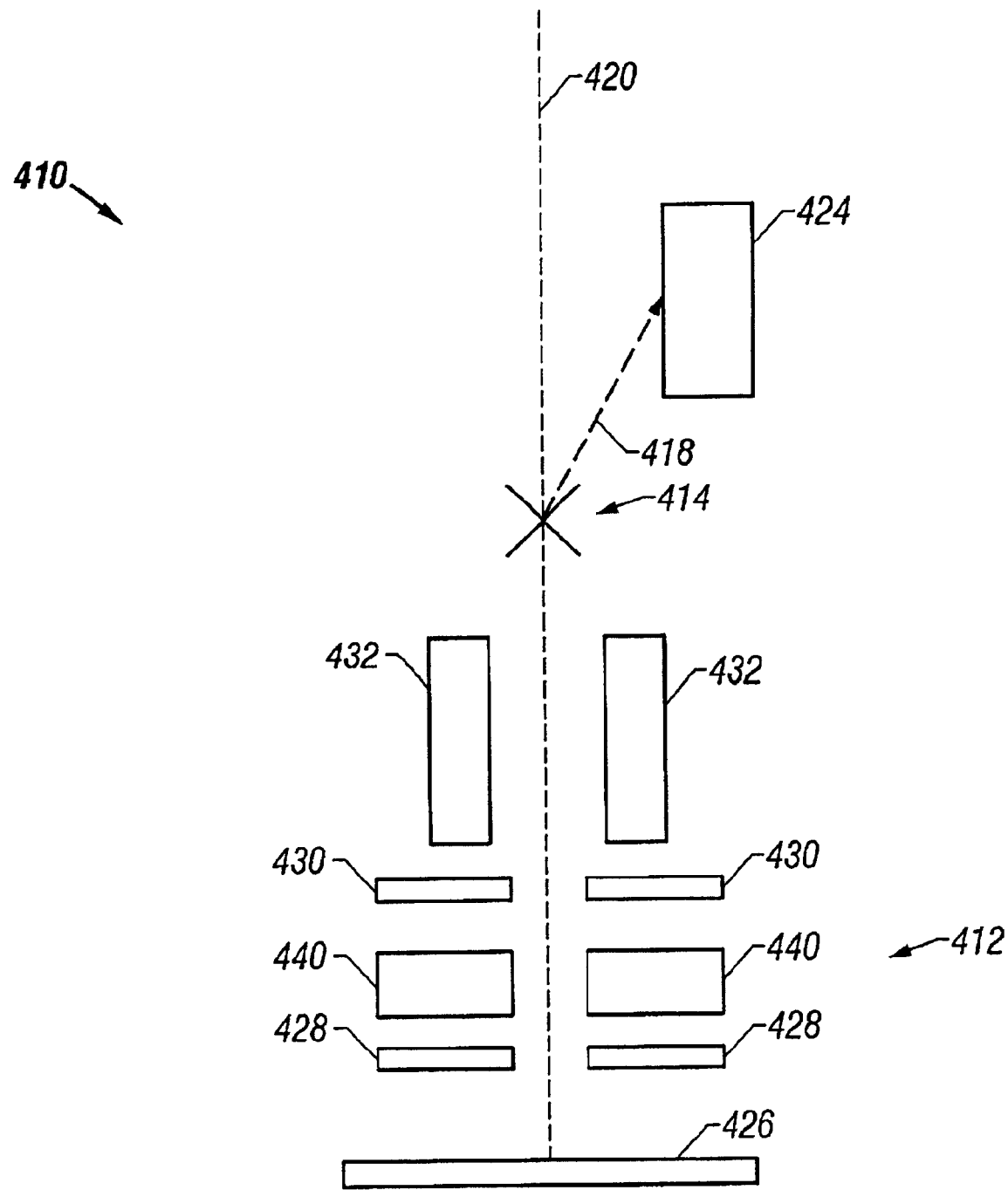
FIG. 4 is a cross-sectional view of a FIB column using a through-the-lens secondary particle detector.

FIG. 4 shows a TTL detection system for an ion column 410 in which low energy secondary electrons from the sample, having energies of about 5 eV (electron volts), are accelerated up through the lens 412 by positive potentials on the elements of lens 412, the deflector plates 432 and magnetic deflector 414. The TTL system in FIG. 4 utilizes a magnetic deflector 414 to deflect the secondary electrons 418 off to the side while allowing the high mass-to-charge ratio primary ions 420 to pass nearly straight through column 410. Alternatively, a Wien filter or an electrostatic deflection device could be used. An electron detector 424, such as a scintillator, continuous dynode multiplier, or channel plate, is then placed to the side for collecting and amplifying the electron signal for processing by standard FIB video electronics.

In the embodiment of FIG. 4, a sample 426 and a lower lens element 428 are maintained at approximately ground potential. An upper lens element 430 is biased to between about +500 and +5000 volts with respect to ground to continue the secondary electron velocities upward beyond the lens 412. Similarly, electrostatic deflector plates 432 and deflector 414 are biased to between about +500 and +5000 volts to continue this upward velocity of secondary electrons 418 towards electron detector 424, the input of which must be similarly biased.

Figure 6:
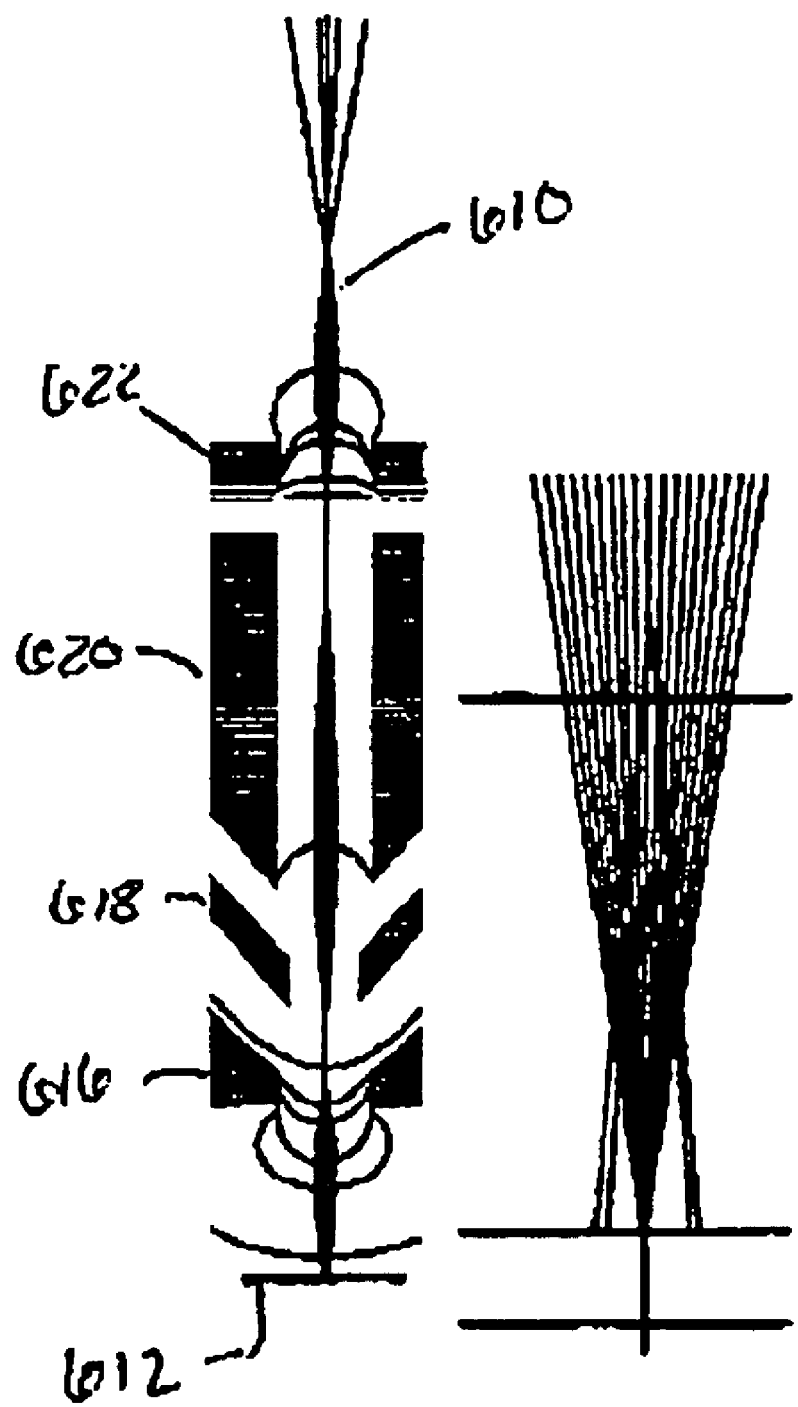
FIG. 6 is an electron optics computer simulation of the secondary electron trajectories from the sample through the lenses of FIG. 4.

The approximately 5 eV secondary electrons are accelerated rapidly by the lens element 440, which is at high positive potential, such as about 20,000 Volts. These electrons are decelerated as they pass through the lens element 430 and the deflection electrodes 432, but the secondary electrons still maintain trajectories that remain relatively close to the column axis. Magnetic deflector 414 or other separation device then directs the electrons toward the detector 424. FIG. 6 is an electron optics computer simulation of the secondary electrons 610 traveling from a sample 612 back through optical elements 616, 618, 620, and 622, with element 616 having a potential relative to sample 612.

Figure 5:
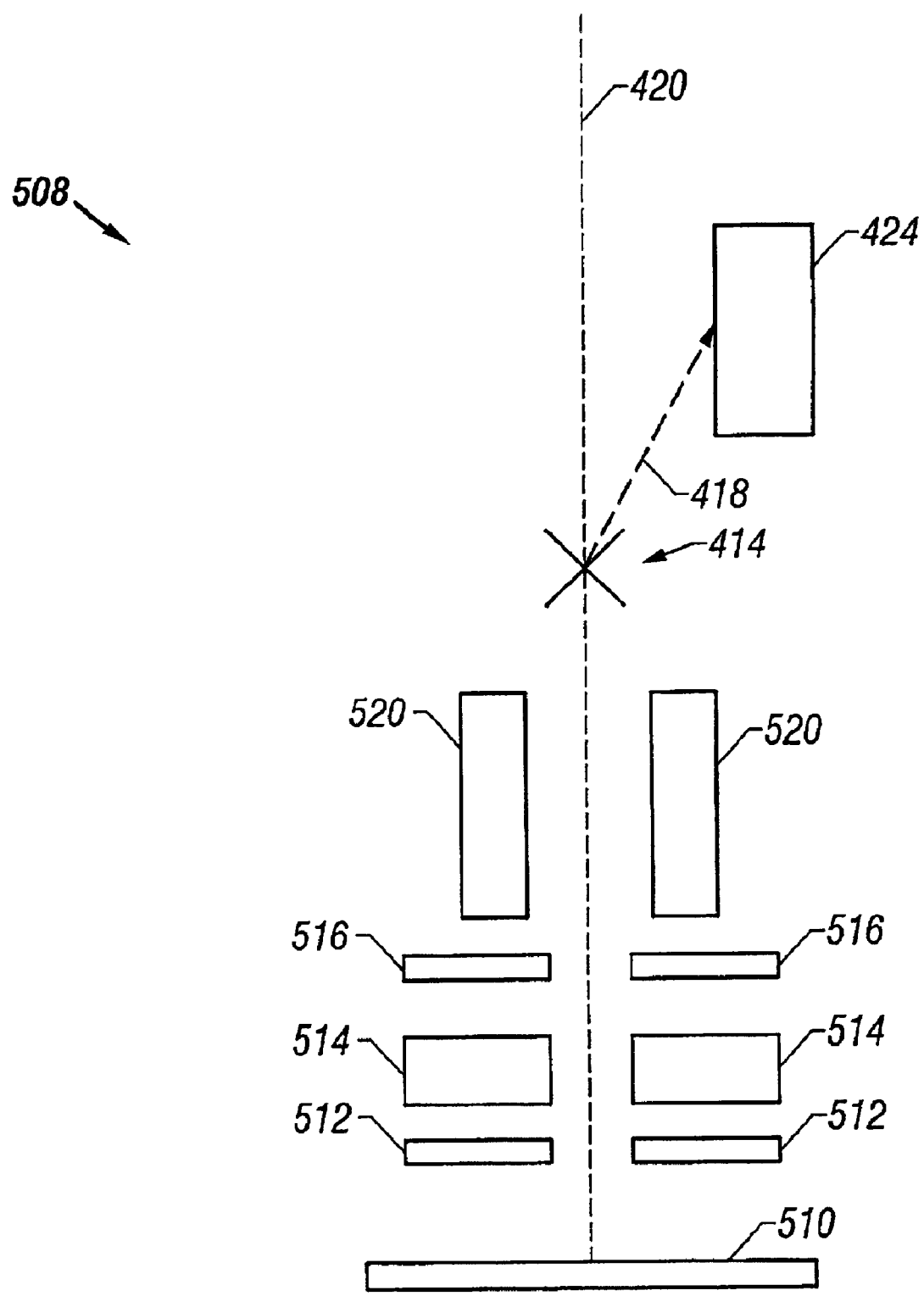
FIG. 5 is a cross-sectional view of another FIB column of using a through-the-lens secondary particle detector.

FIG. 5 shows an alternate ion column 508 design using a TTL secondary electron detector. A sample 510 and a lower final lens element 512 are each biased about −2000 V negative to propel the electrons back through the lens. If it is desired to collect secondary positive ions instead of electrons, sample 510 and lower final lens element 512 can be biased to about +2000 V. Center lens element 514 is biased to approximately +20,000 V. Lens element 516, electrostatic deflector elements 520 and deflector 414 need not be positively biased, which simplifies the electronics and the optics construction. If the ion beam systems include other devices, such as gas injectors, these devices must also be biased to the same potential as the sample.

The apparatus in FIG. 4 also may be used to detect secondary positive ions from the sample. To collect secondary positive ions, the lens 2 element 440 is biased to a negative potential. (Lens 2 is then an acceleration lens). In addition, electrostatic deflector 432, the deflector 414 and the input of particle detector 424 are negatively biased. Similarly, the potentials in FIG. 5 may be changed to collect and detect positive secondary ions. A quadrupole or other mass spectrometer can also be placed in the position of detector 424 to perform Secondary Ion Mass Spectrometry. The appropriate biasing of the column and detector may be employed to detect either positive or negative ions.

For thin film head trimming or other applications, the ion beams must be tilted about +/−3 degrees with respect to the normal to the sample surface. This beam tilting is to achieve undercutting or to yield cuts to the sides of the head with walls more normal to the head surface. This +/−3 degree tilt can be achieved, for example, by tilting every other mw of columns by about +/−3 degrees with respect to the normal to the sample surface. In other words, in a multi-chamber system, the ion guns in one chamber can be tilted at an angle of about 3 degrees from a normal to the sample surface and the ion suns in the next chamber are tilted at an angle of about three degrees from a normal to the sample surface in an opposite direction.

The inventions described above can be embodied in a variety of systems, and the advantages delineated below can be provided in many or all of the embodiments. Because the embodiments will vary with the goals of a particular application, not all advantages will be provided, or need to be provided, in all embodiments.

An advantage of the invention is an increase in the processing speed by providing a system including multiple ion guns capable of operating simultaneously on one or more targets.

Another advantage of the invention is that it provides a system in which the multiple ion guns operate on one or more targets in a single primary vacuum chamber.

Another advantage of the invention is that it provides a system in which the multiple ion guns are in a gun chamber capable of being vacuum isolated from the main chamber, that is, the gun chamber is capable of being evacuated or exposed to atmosphere independently, without disrupting the vacuum in the main chamber.

Another advantage of the invention is that it provides a system in which the multiple ion guns are positioned in multiple gun chambers, each gun chamber containing one or more ion guns and each gun chamber capable of being vacuum isolated from the main chamber and from each other.

Another advantage of the invention is that it provides a multiple ion gun system in which a portion of the ion column elements are in the primary vacuum chamber.

Another advantage of the invention is that it provides a system in which an ion gun or set of ion guns in one chamber can be replaced while maintaining a vacuum in the main chamber and in other gun chambers.

Another advantage of the invention is that it provides a system that uses multiple ion guns and provides the capability to detect secondary particles emitted from a sample at the target point of each of the multiple guns.

Another advantage of the invention is that it provides charged particle optical elements in parallel for multiple columns and a method of efficiently manufacturing such elements.

Another advantage of the invention is that it provides such charged particle optical elements with at least one of the optical elements being individually controllable.

Another advantage of the invention is that it provides an electrode design for a multiple column focused ion beam system that reduces the number of high voltage power supplies required for the system.

Another advantage of the invention is that it provides a multiple column focused ion beam system using fewer high voltage power supplies than the number of columns.

Another advantage of the invention is that it provides an electrode design and voltage application scheme that reduces the voltage requirement of the high voltage power supply.

Another advantage of the invention is that it reduces the cost of processing multiple targets simultaneously from the cost of using multiple, single beam focused ion beam systems.

Another advantage of the invention is that individual emitters can be restarted by individually increasing the extraction voltage of that particular gun and not disturb the other gun voltages. This can be achieved either by increasing the extractor voltage with respect to the emitter/suppressor elements by using isolated extractor elements, or by increasing the emitter/suppressor voltage with respect to the common extractor voltage for that particular gun.

Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. An apparatus including multiple ion guns and multiple associated ion optical columns for focused ion beam processing of materials or imaging, comprising:

a sealable ion gun chamber having positioned therein multiple ion guns, each ion gun capable of generating an ion beam;

multiple ion optical columns, each ion optical column being associated with one of the multiple ion guns for focusing and directing the corresponding ion beam toward a target;

a primary vacuum chamber for containing a target for processing or imagine; and a vacuum valve associated with each of the ion guns, the vacuum valves selectively opening to allow the corresponding ion beam to pass from the associated ion gun to the target or selectively closing to seal the corresponding ion gun chamber.

2. An apparatus including multiple ion guns and multiple associated ion optical columns for focused ion beam processing of materials or imaging, comprising
multiple sealable ion gun chambers each including one or more ion guns, each ion gun capable of generating an ion beam;
multiple ion optical columns, each ion optical column being associated with one of the multiple ion guns for focusing and directing the corresponding ion beam toward a target;
a primary vacuum chamber for containing a target for processing or imaging
a vacuum valve associated with each of the ion guns, the vacuum valves selectively opening to allow the corresponding ion beam to pass from the associated ion gun to the target or selectively closing to seal the corresponding ion gun chamber.

3. The apparatus of claims 2 in which each sealable gun chamber includes a vacuum pump.

4. The apparatus of claim 2 in which the vacuum valves associated with the ion guns in each of multiple gun chambers are connected so that the vacuum valves in each gun chamber open and close using a single control.

5. The apparatus of claim 1 in which each of the ion optical columns includes a deceleration lens element maintained near ground potential.

6. The apparatus of claim 1, in which each of the ion optical columns includes optical elements and in which corresponding ones of at least one of the optical elements in different ones of the ion optical columns within the sealable gun chamber comprise an optical element bar to provide a common voltage to corresponding optical elements within the gun chamber.

7. The apparatus of claim 6, in which electrically isolated lens elements are placed in the optical element bar to allow independent control of some of the optical elements comprising the optical element bar.

8. The apparatus of claim 1 in which the ion optical columns includes multiple lens elements and further comprising means for collecting secondary particles through at least one of the lens elements for imaging or characterizing the target.

9. The apparatus of claim 8, in which at least one of the ion optical column further includes a deflector for deflecting secondary particles out of the path of the ion beam and in which the ion optical column includes at least one lens element between the deflector and the target, the lens element electrically biased relative to the target to create an electrical field to accelerate the charged secondary particles up through and past the lens element for detection.

10. The apparatus of claim 8, in which the target is biased to the same polarity as that of the charge on the secondary charged particles to accelerate the charged particles up through and past the lens and electrostatic deflector for detection.

11. The apparatus of claim 8, further comprising means for detecting charged secondary particles where the detector of charged particles is a channel plate multiplier or scintillator detector placed substantially perpendicular to the primary beam with a center hole for the primary beam to pass through.

12. The apparatus of claim 8, further comprising a magnetic deflector, a Wien filter or an electrostatic deflection device for deflecting the secondary particles away from the ion beam path for collection.

13. The apparatus in claim 8, further comprising a mass spectrometer for Secondary Ion Mass Spectrometry for detecting and characterizing the secondary charged particles.

14. The apparatus of claim 1 in which at least some of the ion guns and ion optical columns are tilted at an angle of about three degrees to a normal to the sample surface.

15. The apparatus of claim 14 in which the ion guns in a first one of the multiple ion beam gun chamber are tilted at an angle of about three degrees in a first direction from a normal to the sample surface and in which the ion guns in a second one of the multiple ion beam gun chamber are tilted at an angle of about three degrees from a normal to the sample surface in a direction opposite to the first direction.

16. The apparatus of claim 1 in which each of the ion optical columns includes beam offset, scanning, steering and stigmation controls and in which the beam offset, scanning, steering and stigmation can be controlled independently for each column.

17. The apparatus of claim 1 further comprising a high voltage supply for providing a high voltage to corresponding optical elements in multiple ones of the ion optical columns.

18. The apparatus of claim 17 further comprising means for adjusting the voltage in one of the ion optical columns to deviate from the high voltage provided by the high voltage power supply.

19. A multiple column focused ion beam system comprising:
multiple ion guns for forming multiple ion beams;
a bar having holes for forming therein multiple ion optical lenses, each ion optical lens corresponding to one of the multiple ion beam sources, each ion beam source and ion optical lens forming pan of an ion beam optical column; and
a power supply for applying a voltage to lenses corresponding to the bar, thereby applying a common voltage to ion optical lenses in different optical columns.

20. The apparatus of claim 19 in which the bar comprises a flat conductive bar and in which the power supply provides a voltage directly to the conductive bar, the holes in the conductive bar functioning as ion optical lenses.

21. The apparatus of claim 19 in which the bar comprises a flat conductive bar having electrically isolated lenses formed therein and in which the power supply provides a common voltage to all lenses in the bar and selectively provides a second voltage to individual lenses in the bar.

22. The apparatus of claim 19 in which the bar comprises a flat non-conductive bar having electrically isolated lenses formed therein and in which the power supply provides a common voltage to all lenses in the bar and selectively provides second voltages to individual lenses in the bar.

23. The apparatus of claim 19 further comprising means for collecting through the lenses secondary particles emitted from the target, the secondary particles being used to image or to characterize the target.

24. The apparatus in claim 22 in which individual emitters are restarted by biasing either the extractor with respect to the emitter/suppressor elements about −2000 V, or by biasing the emitter/suppressor elements with respect to the extractor element about 2000 V, in the individual guns as needed.

25. The apparatus of claim 1 wherein at least one said ion beam is generated employing a liquid metal ion source.

26. The apparatus of claim 8, in which said multiple lens elements includes an electrostatic final lens for focusing the ion beam onto the target and further comprising a means for collecting secondary particles emitted from the target and traveling through said electrostatic lens for imaging or characterizing the target.

27. The apparatus of claim 2, in which the ion optical column includes multiple lens elements and further comprising means for collecting secondary particles through at least one of the lens elements for imaging or characterizing the target.

28. The apparatus of claim 2 in which each of the ion optical columns includes beam offset, scanning, steering and stigmation controls and in which the beam offset, scanning, steering and stigmation can be controlled independently for each column.

29. The apparatus of claim 2 further comprising a high voltage supply for providing a high voltage to corresponding optical elements in multiple ones of the ion optical columns.

30. The apparatus of claim 2 wherein at least one said ion beam is generated employing a liquid metal ion source.

* * * * *